United States Patent
Seo et al.

(10) Patent No.: US 7,580,532 B2
(45) Date of Patent: Aug. 25, 2009

(54) MULTI-CHANNEL PULSE WIDTH MODULATION APPARATUS

(75) Inventors: Dong Han Seo, Kyunggi-do (KR); Oh Suk Kwon, Seoul (KR); Jong Woo Kim, Seoul (KR); Jae Gun Lee, Incheon-si (KR); Chan Tae Kim, Boosan-si (KR)

(73) Assignee: LG Electronics Inc., Seoul (KR)

( * ) Notice: Subject to any disclaimer, the term of this patent is extended or adjusted under 35 U.S.C. 154(b) by 385 days.

(21) Appl. No.: 10/628,380

(22) Filed: Jul. 29, 2003

(65) Prior Publication Data

US 2004/0028243 A1   Feb. 12, 2004

(30) Foreign Application Priority Data

Aug. 6, 2002   (KR) ................. 10-2002-0046332
Aug. 8, 2002   (KR) ................. 10-2002-0046897
Aug. 10, 2002  (KR) ................. 10-2002-0047335

(51) Int. Cl.
*H04R 3/00*   (2006.01)

(52) U.S. Cl. .................. 381/111; 375/238; 332/109; 369/14; 330/10

(58) Field of Classification Search .............. 381/111, 381/107, 108, 104, 98, 117; 375/238, 224, 375/286, 377; 332/109; 370/204, 205, 212, 370/203; 330/10, 251, 207 A; 369/1, 14
See application file for complete search history.

(56) References Cited

U.S. PATENT DOCUMENTS

| | | | | |
|---|---|---|---|---|
| 4,173,739 A | * | 11/1979 | Yoshida | ............ 330/298 |
| 4,641,361 A | * | 2/1987 | Rosback | ............ 381/103 |
| 5,771,301 A |   | 6/1998 | Fuller et al. | |
| 5,796,359 A | * | 8/1998 | Beard | ............ 341/143 |
| 5,940,021 A | * | 8/1999 | Ahn | ............ 341/155 |
| 6,107,876 A | * | 8/2000 | O'Brien | ............ 330/10 |

(Continued)

FOREIGN PATENT DOCUMENTS

EP   1 028 524   2/1999

(Continued)

OTHER PUBLICATIONS

Korean Office Action dated Jan. 25, 2005.

(Continued)

*Primary Examiner*—Vivian Chin
*Assistant Examiner*—Con P Tran
(74) *Attorney, Agent, or Firm*—Ked & Associates LLP

(57) ABSTRACT

Disclosed are multi-channel PWM (Pulse Width Modulation) apparatuses and methods for modulating PCM-based multi-channel audio signals read from an optical medium into PWM-based multi-channel audio signals. A multi-channel PWM apparatus and method can reduce noise from amplifying PCM-based audio signals having adjacent signal processing paths. The multi-channel PWM apparatus and method selectively vary only gains of some channels in a plurality of channels in order to allow an audio signal applied to a pulse width modulator to have a different level in individual channels in a prescribed system condition (e.g., overload). The multi-channel PWM apparatus can selectively enable a subset among a plurality of pulse width modulators to reduce unnecessary driving and noise. Thus, preferred embodiments can reduce or prevent deterioration of output audio signals.

15 Claims, 15 Drawing Sheets

U.S. PATENT DOCUMENTS

| | | | |
|---|---|---|---|
| 6,429,737 B1 * | 8/2002 | O'Brien | 330/10 |
| 6,473,009 B2 * | 10/2002 | Grosso et al. | 341/102 |
| 6,538,523 B2 * | 3/2003 | Sugita et al. | 332/109 |
| 6,567,359 B2 * | 5/2003 | McPherson et al. | 369/59.21 |
| 6,683,494 B2 * | 1/2004 | Stanley | 330/10 |
| 7,047,325 B2 * | 5/2006 | Kondo et al. | 710/16 |

FOREIGN PATENT DOCUMENTS

| | | |
|---|---|---|
| EP | 1 028 524 A1 | 2/1999 |
| EP | 1 178 388 | 8/2000 |
| EP | 1 178 388 | 2/2002 |
| KR | 10-1992-0006016 | 7/1992 |
| KR | 10-2000-0033481 | 6/2000 |
| KR | 10-0268476 | 7/2000 |
| KR | 10-2001-0023262 | 3/2001 |
| KR | 10-2001-0095927 | 11/2001 |
| KR | 20-0262157 | 1/2002 |

OTHER PUBLICATIONS

European Search Report dated Dec. 2, 2003.
Korean Office Action dated Apr. 23, 2009.

* cited by examiner

MULTI-CHANNEL PULSE WIDTH MODULATION APPARATUS

BACKGROUND OF THE INVENTION

1. Field of the Invention

The present invention relates to a multi-channel pulse width modulation (PWM) apparatus.

2. Background of the Related Art

A multifunctional apparatus such as "a DVD receiver" includes an optical disc apparatus and an A/V (Audio/Video) receiver integrated as one body. The optical disc apparatus reads high-quality video and audio signals recorded on an optical disc such as a CD or DVD, and reproduces the audio signal in the form of a PCM (Pulse Code Modulation)—based multi-channel audio signal. The A/V receiver modulates the PCM-based multi-channel audio signal into a PWM (Pulse Width Modulation)—based multi-channel audio signal, and amplifies/outputs the PWM-based multi-channel audio signal through a plurality of speakers.

However, as described above the related art DVD receiver has various disadvantages. For example, the PWM-based multi-channel audio signals generate noise, particularly between adjacent signal processing paths. Further, such generated noise can be significant at a time of a rising edge and a falling edge of data signals to deteriorate sound quality. In addition, the PWM-based multi-channel audio signals have system level gain control identically across channels, so a user cannot independently selectively control gain of an audio signal of a desired channel. Also, a system overload condition signal is a system level control across channels to stop the PWM when system load exceeds a reference value. Accordingly, additional noise can be generated by the PWM apparatus.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention to provide a multi-channel PWM apparatus and method for allowing PCM-based audio signals having adjacent signal processing paths (e.g., hardware) to have a different phase between individual channels reducing or removing noise generated when amplifying the PCM-based audio signals.

Another object of the present invention to provide a multi-channel PWM apparatus and method for allowing an audio signal applied to a pulse width modulator to have a different or an independent level in each of individual channels in selected conditions (e.g., overload).

Another object of the present invention to provide a multi-channel PWM apparatus and method that reduces PWM operations such as by selectively enabling among a plurality of pulse width modulators.

In accordance with one aspect of the present invention, at least the above and other objects can be accomplished in a whole or in part by the provision of a multi-channel PWM (Pulse Width Modulator) apparatus that includes a plurality of pulse width modulators for modulating multi-channel audio signals into PWM-based multi-channel audio signals, and a plurality of phase shifters for phase-shifting modulated output signals received from the pulse width modulators.

To further achieve at least the above objects in a whole or in part, and in accordance with another aspect of the present invention, there is provided a multi-channel PWM (Pulse Width Modulator) apparatus, a plurality of pulse width modulation circuits for modulating audio signals into PWM-based multi-channel audio signals, and gain control circuits for receiving the audio signals received at the plurality of pulse width modulation circuits, wherein the gain control circuits independently controls gains of the received audio signals according to individual channels.

To further achieve at least the above objects in a whole or in part, and in accordance with yet another aspect of the present invention, there is provided a multi-channel PWM (Pulse Width Modulator) apparatus that includes a plurality of pulse width modulators for modulating multi-channel audio signals into PWM-based multi-channel audio signals, and a controller for independently turning on/off the plurality of pulse width modulators according to individual channels.

To further achieve at least the above objects in a whole or in part, and in accordance with another aspect of the present invention, there is provided an audio/visual receiver that includes a reader configured to output a first data signal based on information stored in a recording medium, a tuner configured to output a second data signal, a decoder coupled to the reader configured to decode the data signals into audio signals, a pulse width modulator device configured to modulate the audio signals into PWM-based multi-channel audio signals that includes a plurality of pulse width modulators configured to modulate the audio signals into the PWM-based multi-channel audio signals and a plurality of signal controllers coupled to the plurality of modulators to independently control at least one of input signals and output signals of the plurality of pulse width modulators, and a speaker configured to receive and output the PWM-based multi-channel audio signals.

To further achieve at least the above objects in a whole or in part, and in accordance with another aspect of the present invention, there is provided a multi-channel PWM (Pulse Width Modulator) apparatus that includes a plurality of pulse width modulators configured to modulate audio signals into PWM-based multi-channel audio signals and a plurality of signal controlling units coupled to the plurality of modulators for controlling at least one of input signals and output signals of the plurality of pulse width modulators.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
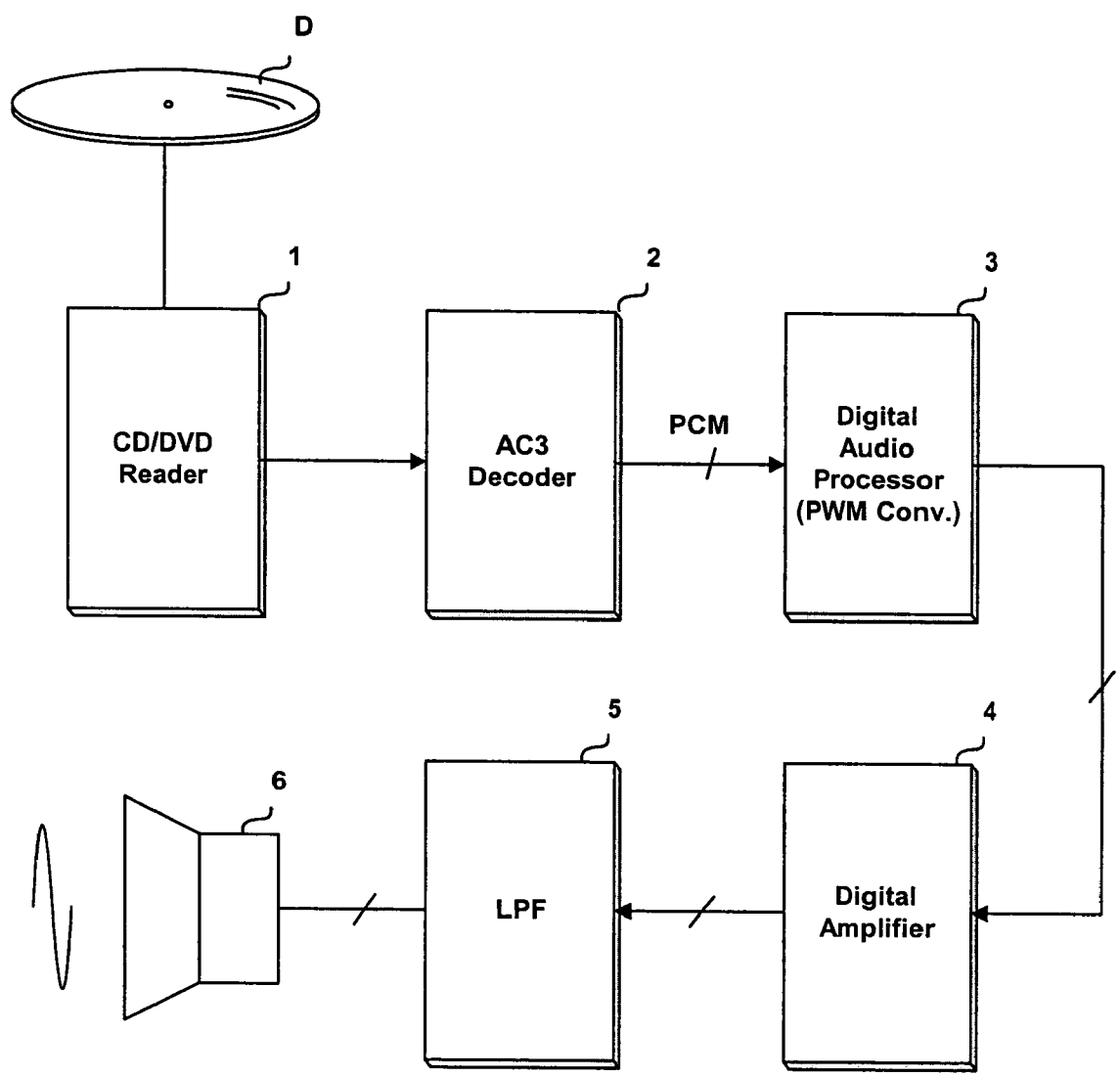
FIG. 1 is a block diagram showing an exemplary DVD receiver as an apparatus adopting a multi-channel PWM process.

FIG. 1 is a block diagram showing an exemplary DVD receiver as an apparatus adopting a multi-channel PWM process. As shown in FIG. 1, the DVD receiver can include a CD/DVD reader 1, an audio decoder 2, a digital audio processor 3, a digital amplifier unit 4, a LPF (Low Pass Filter) unit 5 and a speaker unit 6.

The CD/DVD reader 1 reads high-quality video and audio signals recorded on an optical disc D such as a CD or DVD, and reproduces corresponding audio signals. For example, when the audio signals are recorded on the disk D in the form of AC3-based multi-channel audio signals, the CD/DVD reader 1 reproduces the audio signals in the form of AC3-based multi-channel audio signals.

The audio decoder 2 decodes the multi-channel audio signals (e.g., AC3-based) supplied through a digital audio interface from the CD/DVD reader 1 to convert them into PCM (Pulse Code Modulation)-based multi-channel audio signals. The digital audio processor 3 can modulate the PCM-based multi-channel audio signals into PWM-based multi-channel audio signals, and the digital amplifier unit 4 amplifies individual channels of the PWM-based multi-channel audio signals to be higher than a prescribed level. The LPF unit 5 passes audio signal lower than 20 KHz in the multi-channel audio signals of individual channels, and outputs through speakers of the speaker unit 6.

Figure 2:
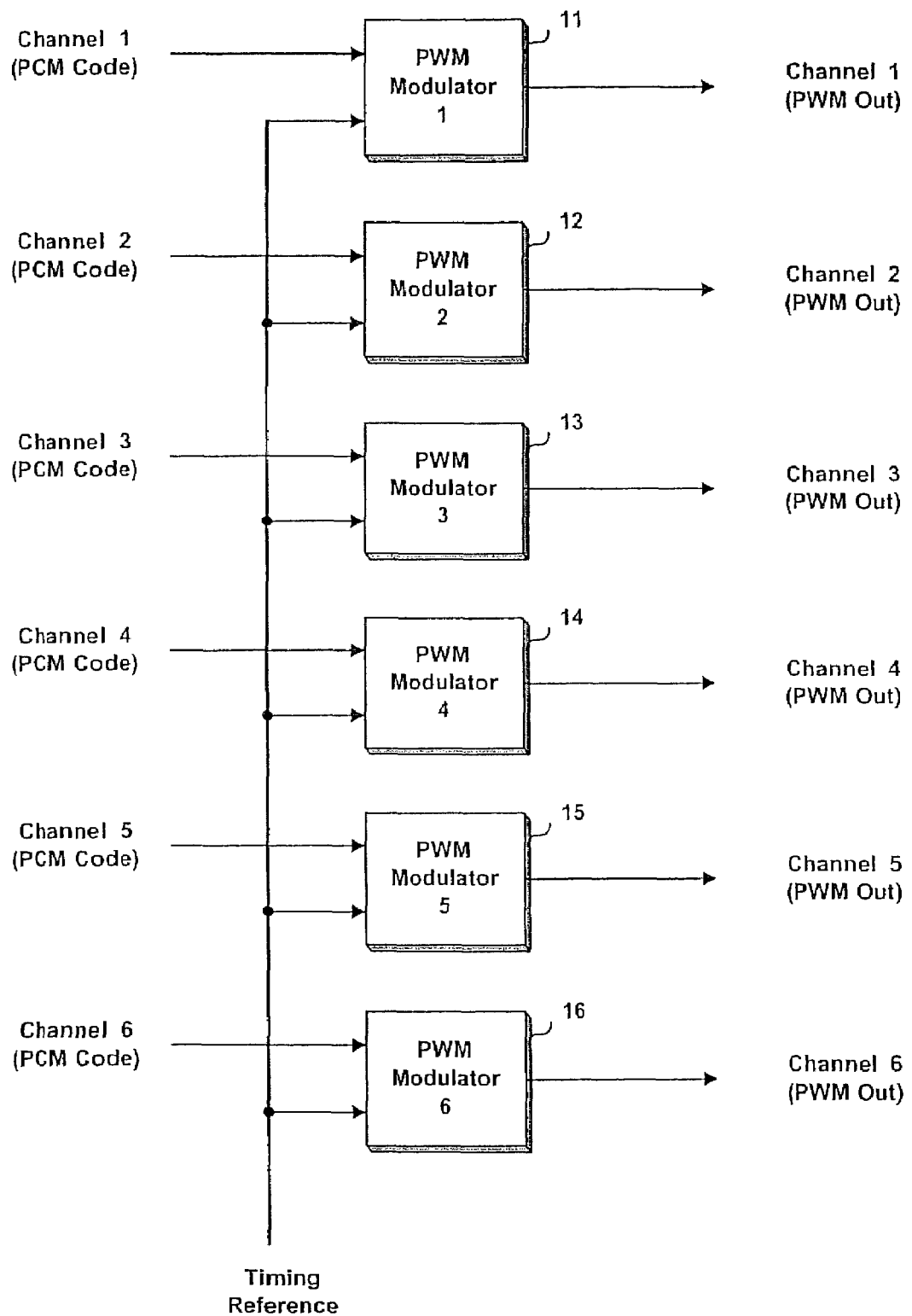
FIG. 2 is a block diagram showing a related art multi-channel PWM apparatus.

As shown in FIG. 2, the DVD receiver contains a plurality of pulse width modulators for modulating a PCM-based audio signal into a PWM-based audio signal. For example, six pulse width modulators 11~16 can be provided for PWM-modulating a PCM-based two-channel audio signal of a CD and a PCM-based six-channel audio signal of a DVD while being classified according to individual channels.

When reproducing data of a CD in an optical disc apparatus contained in the DVD receiver, PCM-based two-channel audio signals are respectively applied to a first pulse width modulator 11 and a second pulse width modulator 12 classified according to individual channels. When reproducing data of a DVD in the optical disc apparatus, PCM-based 6-channel audio signals are respectively applied to the first to sixth pulse width modulators 11~16 classified according to their channels.

Figure 3:
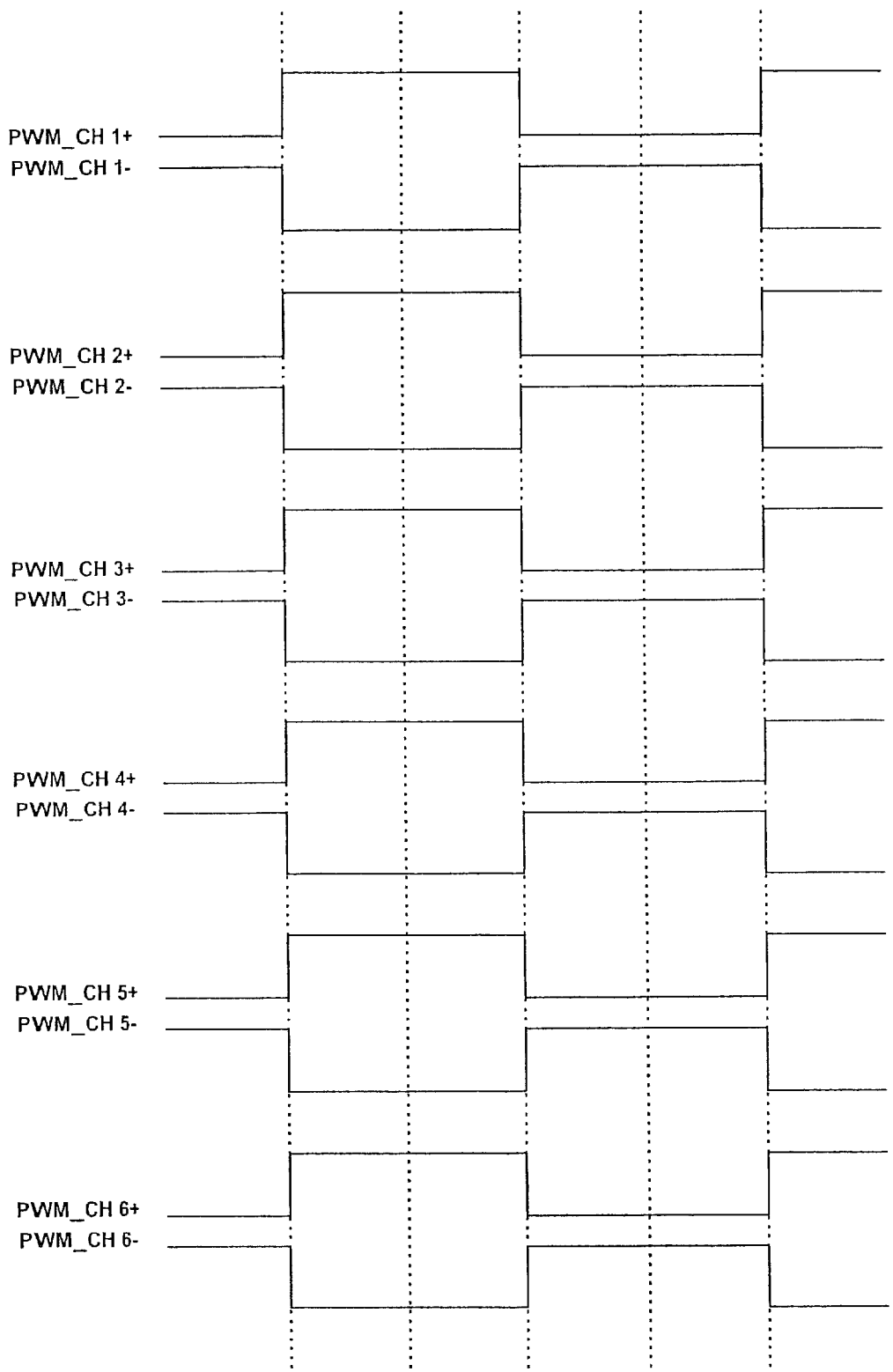
FIG. 3 is a waveform diagram illustrating output signals for every channel modulated by the related art multi-channel PWM apparatus.

As shown in FIG. 3, the pulse width modulators 11~16 output PWM-based audio signals PWM_CH 1+, PWM_CH 1−, PWM_CH 2+, PWM_CH 2−, PWM_CH 3+, PWM_CH 3−, PWM_CH 4+, PWM_CH 4−, PWM_CH 5+, PWM_CH 5−, PWM_CH 6+, and PWM_CH 6−, respectively. In this case, two audio signals PWM_CH 1 and PWM_CH 1−, PWM_CH 2+ and PWM_CH 2−, PWM_CH 3+ and PWM_CH 3−, PWM_CH 4+ and PWM_CH 4−, PWM_CH 5+ and PWM_CH 5−, or PWM_CH 6+ and PWM_CH 6− of each channel are 180 degrees out of phase with each other. The individual channels of the PWM-based audio signals are amplified to be higher than a prescribed level, and audibly outputted through speakers of the channels.

However, the PWM-based audio signals outputted over the pulse width modulators 11~16 are in phase with individual channels as shown in FIG. 3, resulting in generating noise while amplifying PCM-based audio signals having adjacent signal processing paths (e.g., hardware). Particularly, noise is greatly amplified at a prescribed time when a rising edge and a falling edge occur, which can result in deterioration of sound quality.

Figure 4:
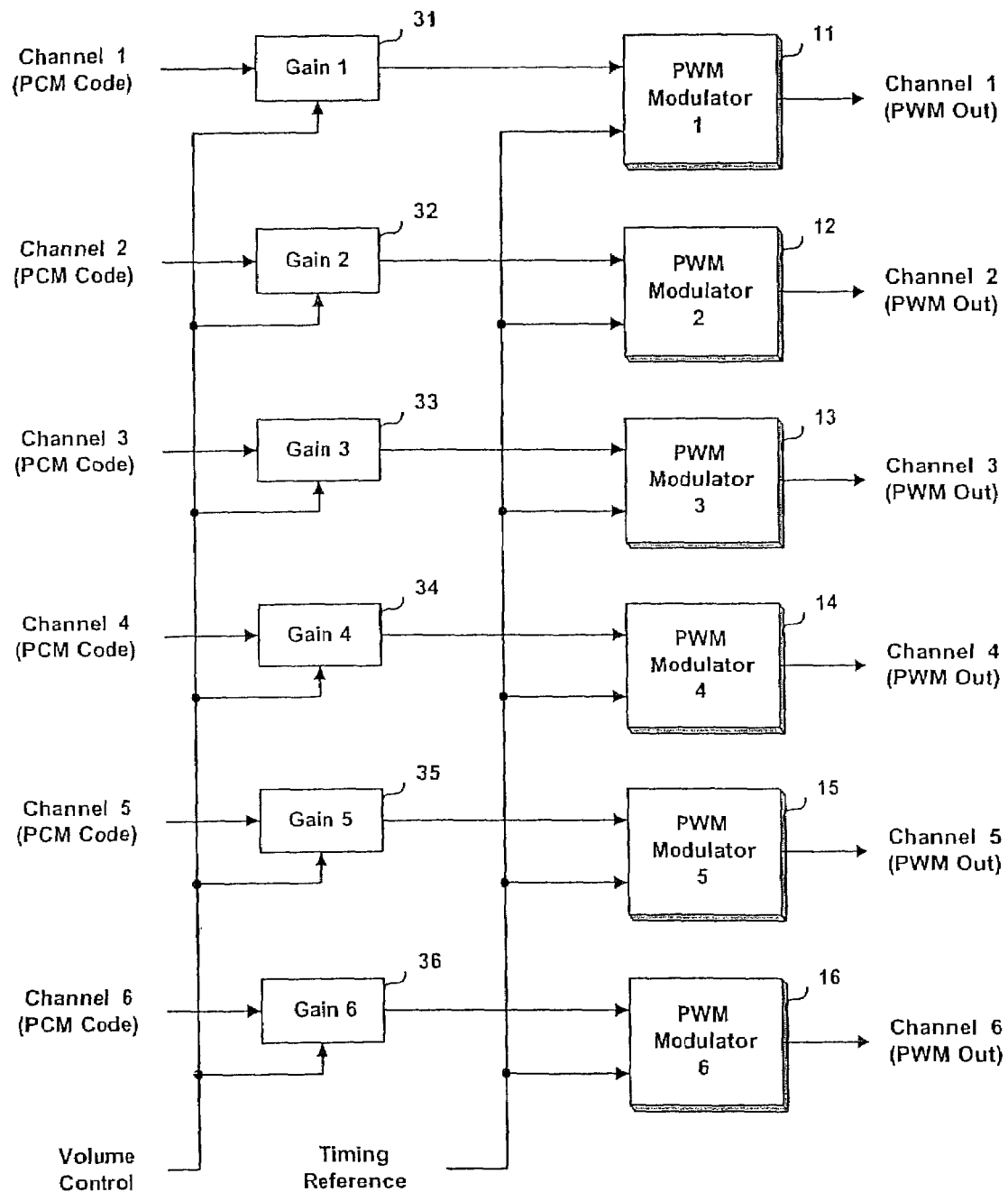
FIG. 4 is a block diagram of a gain controller contained in a related art multi-channel PWM apparatus shown in FIG. 2.

As shown in FIG. 4, the DVD receiver can include six gain controllers 31~36 for receiving PCM-based audio signals applied to pulse width modulators 11~16 for every channel, and controlling levels of the received PCM-based audio signals according to individual channels. The gain controllers 31~36 for every channel control their levels upon receiving a common volume control signal.

For example, in case of reproducing data of a CD in an optical disc apparatus of the DVD-receiver, a PCM-based two-channel audio signal is amplified to a prescribed level over first and second gain controllers 31 and 32, and then applied to the first and second pulse width modulators 11 and 12 classified according to individual channels. In case of reproducing data of a DVD, a PCM-based six-channel audio signal is amplified to a prescribed level over the first to sixth gain controllers 31~36, and then applied to the first to sixth pulse width modulators 11~16 while being classified according to individual channels.

Figure 5:
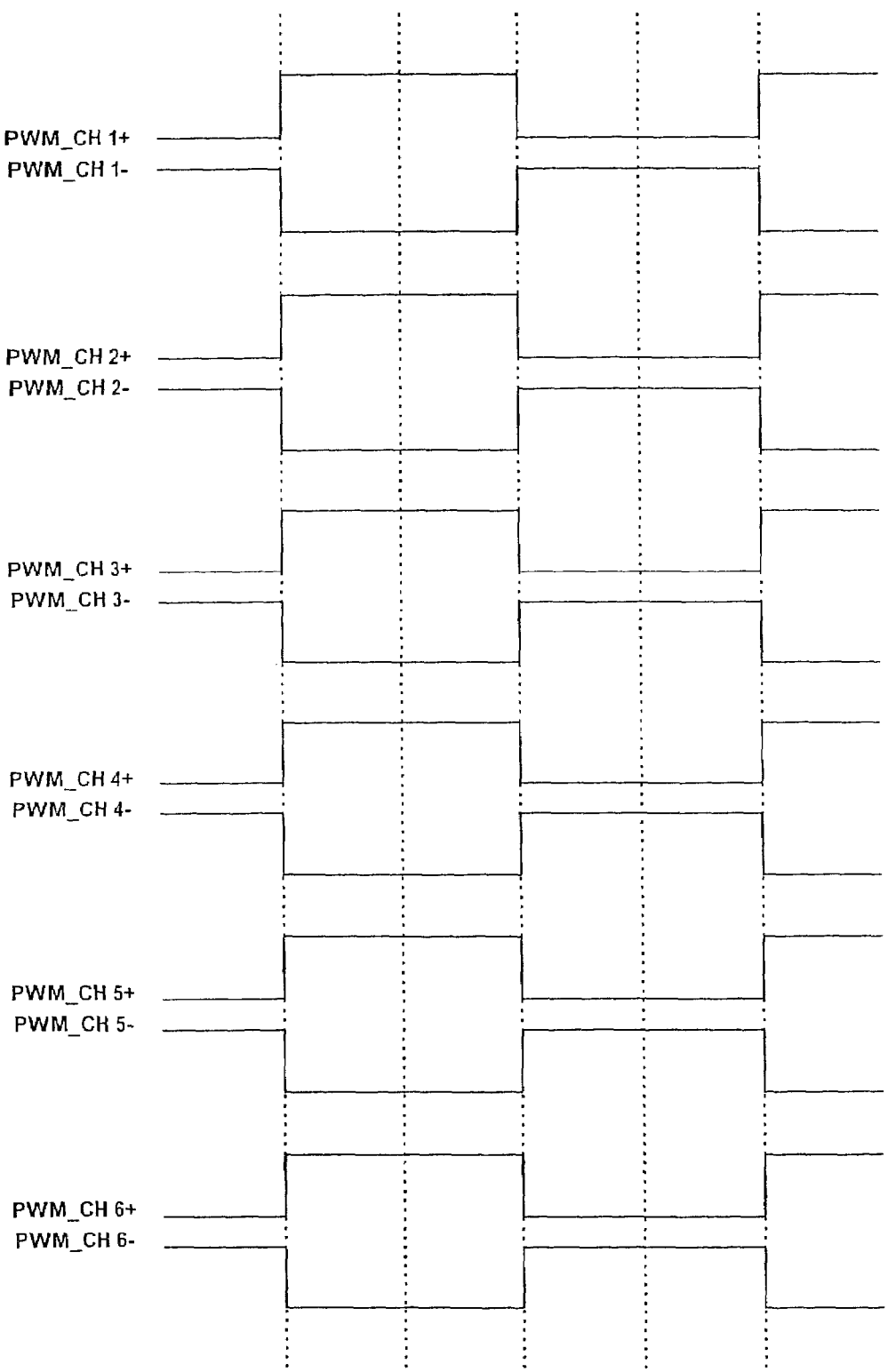
FIG. 5 is a waveform diagram illustrating output signals for every channel modulated by the related art multi-channel PWM apparatus.

As shown in FIG. 5, the pulse width modulators 11~16 output PWM-based audio signals PWM_CH 1+, PWM_CH 1−, PWM_CH 2+, PWM_CH 2−, PWM_CH 3+, PWM_CH 3−, PWM_CH 4+, PWM_CH 4−, PWM_CH 5+, PWM_CH 5−, PWM_CH 6+, and PWM_CH 6−, respectively. In this case, two audio signals PWM_CH 1 and PWM_CH 1−, PWM_CH 2+ and PWM_CH 2−, PWM_CH 3+ and PWM_CH 3−, PWM_CH 4+ and PWM_CH 4−, PWM_CH 5+ and PWM_CH 5−, or PWM_CH 6+ and PWM_CH 6− of each channel are 180 degrees out of phase with each other. The PWM-based audio signals of individual channels are amplified to be higher than a prescribed level, and audibly outputted through speakers of the channels.

However, as shown in FIG. 4, the gain controllers 31~36 for every channel variably and collectively control their own gains according to the commonly received volume control signal, such that it is impossible for the user to selectively vary only a gain of an audio signal of a desired channel. Accordingly, it difficult or impossible to provide a user with a variety of sound fields.

Figure 6:
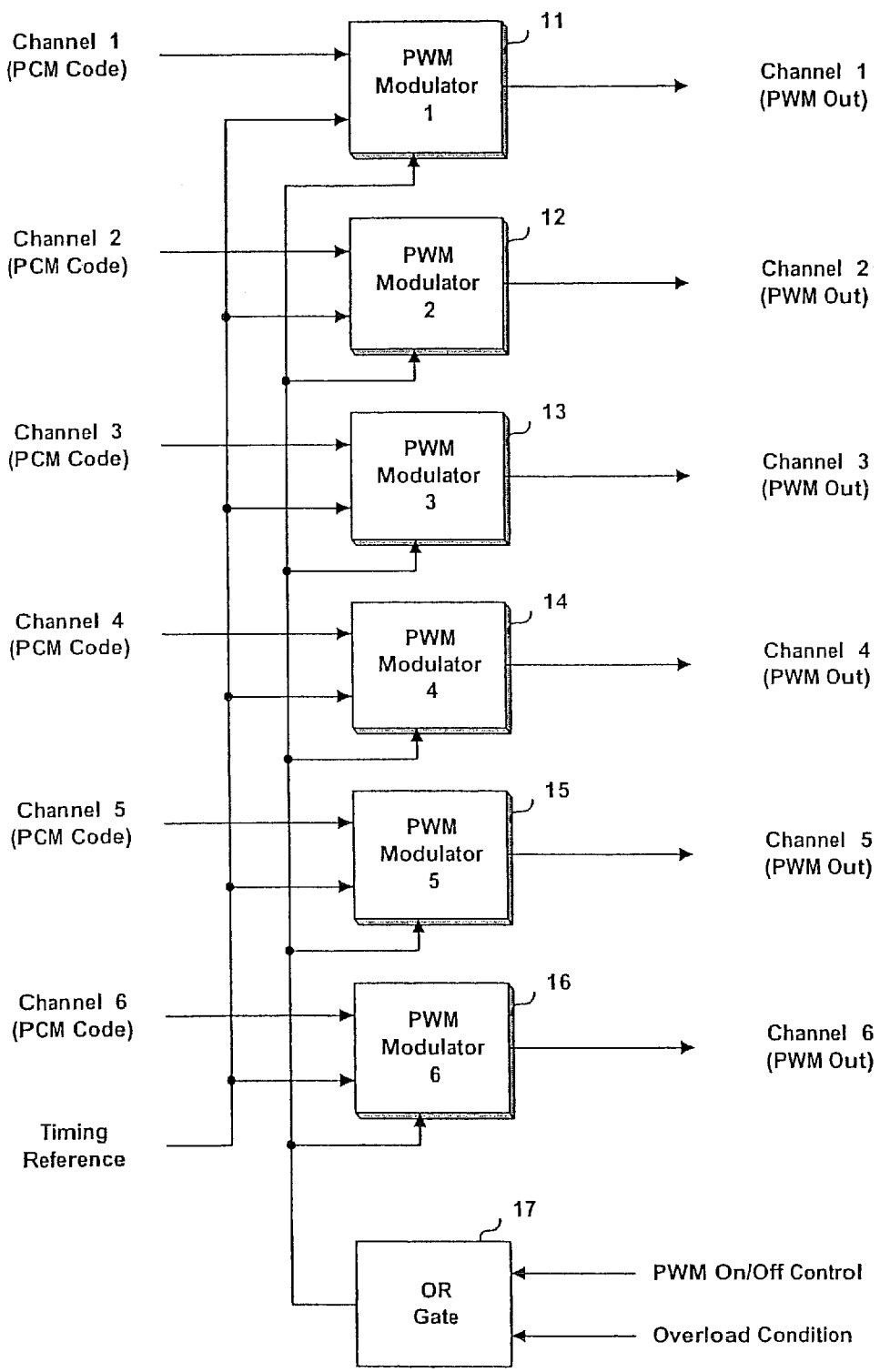
FIG. 6 is a block diagram showing a related art multi-channel PWM apparatus.

As shown in FIG. 6, the DVD receiver can include an OR gate 17 for performing a logic OR operation between an overload condition signal and a PWM on/off control signal in an abnormal system load state beyond a reference load value. The overload condition signal is adapted to compulsorily turn off the pulse width modulators when the value of the system loads is higher than a reference value, and the PWM on/off control signal is adapted to turn on/off the pulse width modulators.

Therefore, when reproducing data of a CD in an optical disc apparatus contained in the DVD receiver, a PCM-based two-channel audio signal is applied to the first pulse width modulator 11 and the second pulse width modulator 12. In the case of reproducing data of a DVD therein, a PCM-based six-channel audio signal is applied to the first to sixth pulse width modulators 11~16 classified according to individual channels.

Figure 7:
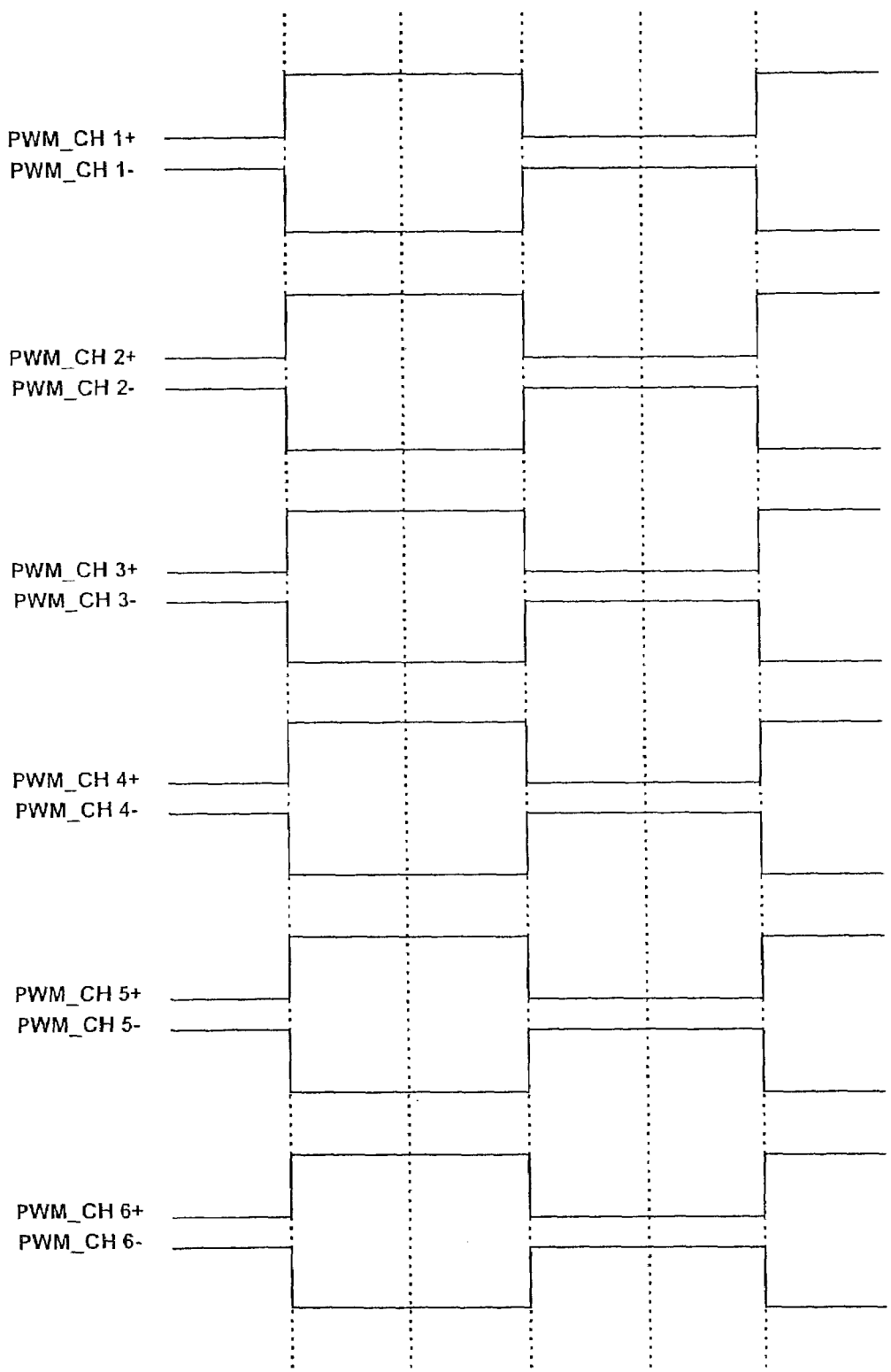
FIG. 7 is a waveform diagram illustrating output signals for every channel modulated by the related art multi-channel PWM apparatus.

As shown in FIG. 7, the pulse width modulators 11~16 output PWM-based audio signals where preferably two audio signals PWM_CH 1 and PWM_CH 1−, PWM_CH 2+ and PWM_CH 2−, PWM_CH 3+ and PWM_CH 3−, PWM_CH 4+ and PWM_CH 4−, PWM_CH 5+ and PWM_CH 5−, or PWM_CH 6+ and PWM_CH 6− for each channel are amplified to be higher than a predetermined level, and then audibly outputted through speakers for every channel.

The OR gate 17 outputs a control signal for interrupting a PWM operation. For example, in the case where the OR gate 17 outputs either an overload condition signal for compulsorily turning off the pulse width modulators when the value of the system loads is higher than a reference value or a PWM-off control signal for compulsorily turning off the pulse width modulators according to a user's key command, the pulse width modulators stop the PWM operations.

Because the control signal generated from the OR gate 17 is applied to the six pulse width modulators 11~16, all the six pulse width modulators 11~16 are turned on or off. In more detail, if the optical disc apparatus contained in the DVD receiver reads a CD, it is difficult or impossible to selectively turn off only third to sixth pulse width modulators 13~16 even though only a PCM-based two-channel audio signal is applied to the first pulse width modulator 11 and the second pulse width modulator 12 and no signal is applied to the remaining third to six pulse width modulators 13~16. Further, meaningless output signals of the third to sixth pulse width modulators 13~16 unavoidably act as noise.

Figure 8:
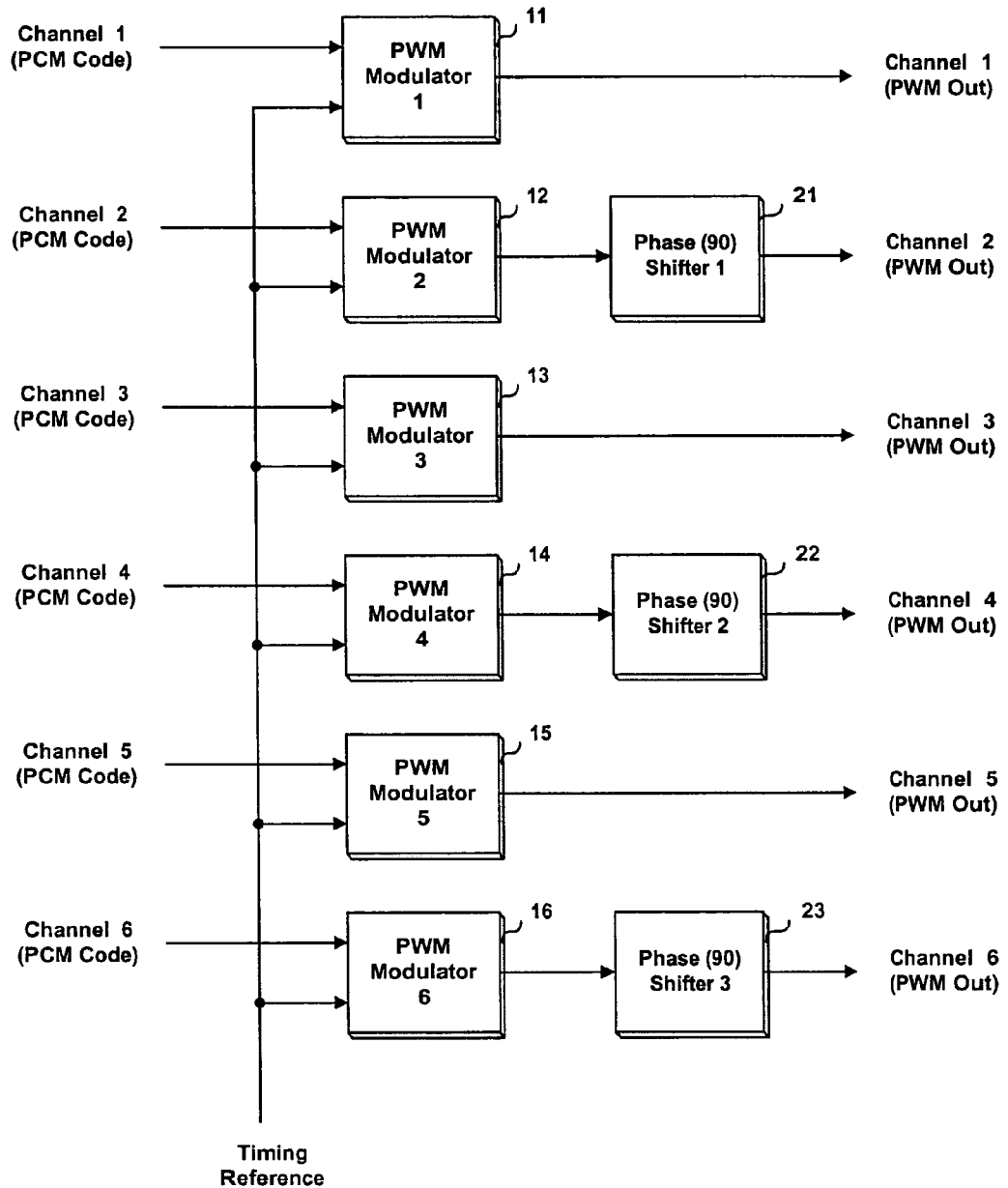
FIG. 8 is a block diagram showing a multi-channel PWM apparatus in accordance with a first preferred embodiment according to the present invention.

A multi-channel PWM apparatus according to a first preferred embodiment in accordance with the present invention will hereinafter be described with reference to FIGS. 8 and 9. As shown in FIG. 8, the multi-channel PWM apparatus according to the first preferred embodiment is applicable to a DVD receiver having an optical disc apparatus and an A/V receiver integrated as one body. The DVD receiver can include six pulse width modulators 11~16 for PWM-modulating a PCM-based two-channel audio signal of a CD, a PCM-based six-channel audio signal of a DVD or the like classified according to individual channels.

In comparison with the related art multi-channel PWM apparatus shown in FIG. 2, the multi-channel PWM apparatus shown in FIG. 8 further preferably includes a plurality of phase shifters. A first phase shifter 21 is for phase-shifting an output signal of the second pulse width modulator 12 by e.g., 90 degrees, a second phase shifter 22 is for phase-shifting an output signal of the fourth pulse width modulator 14 by e.g., 90 degrees, and a third phase shifter 23 is for phase-shifting an output signal of the sixth pulse width modulator 16 by e.g., 90 degrees.

Therefore, in the case of reproducing data of a CD in the optical disc apparatus contained in the DVD receiver, a PCM-based two-channel audio signal is applied to the first pulse width modulator 11 and the second pulse width modulator 12 according to individual channels. In the case of reproducing data of a DVD, a PCM-based six-channel audio signal is applied to the first to sixth pulse width modulators 11~16 classified according to individual channels.

Figure 9:
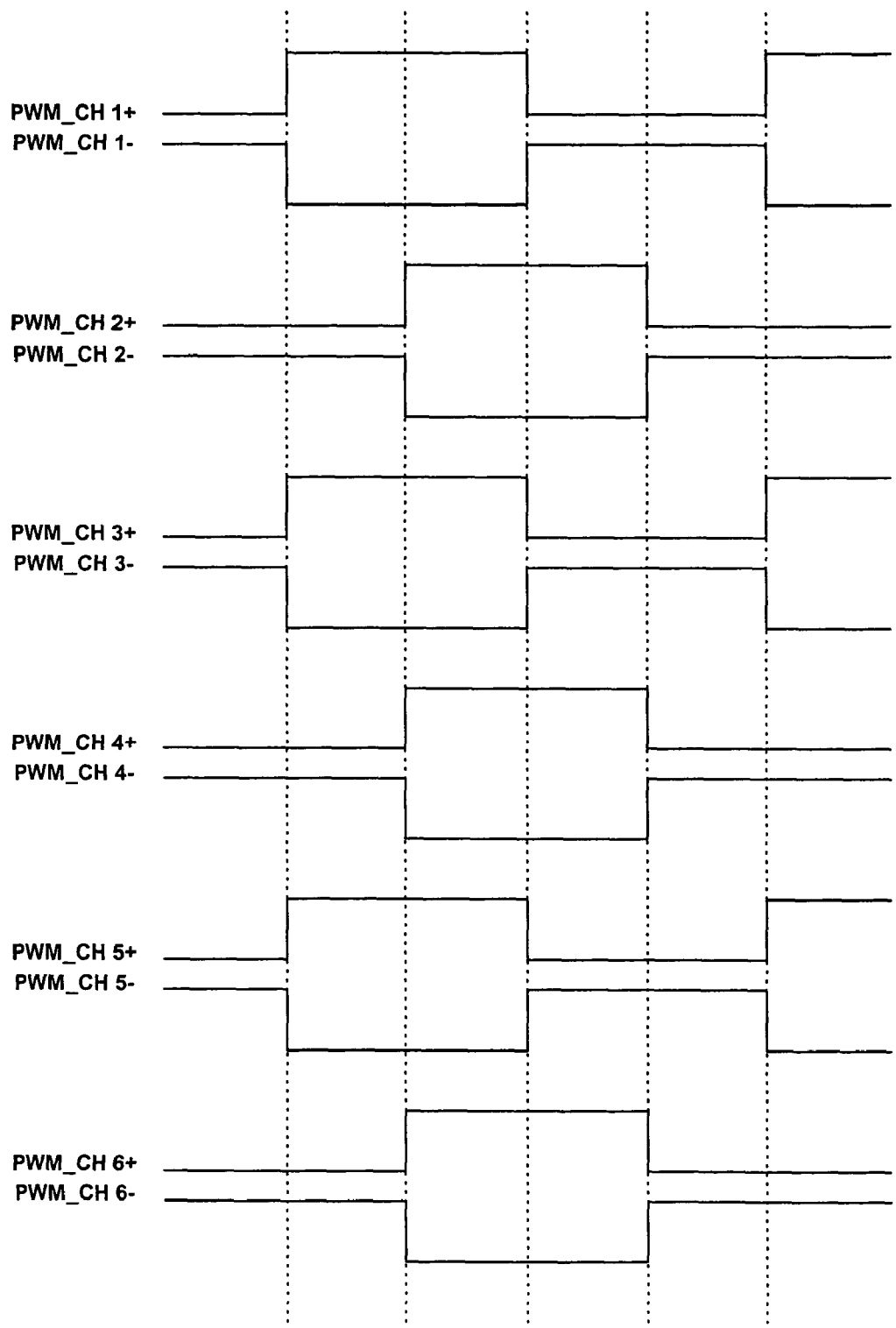
FIG. 9 is a waveform diagram illustrating output signals for every channel modulated and phase-shifted by the multi-channel PWM apparatus of FIG. 8.

On the other hand, as shown in FIG. 9, the PWM apparatus outputs PWM-based audio signals PWM_CH 1+, PWM_CH 1−, PWM_CH 2+, PWM_CH 2−, PWM_CH 3+, PWM_CH 3−, PWM_CH 4+, PWM_CH 4−, PWM_CH 5+, PWM_CH 5−, PWM_CH 6+, and PWM_CH 6−, respectively. In this case, the PWM-based audio signals PWM_CH 2+ and PWM_CH 2− generated from the second pulse width modulator 12 is preferably phase-shifted by 90 degrees in the first phase shifter 21. The PWM-based audio signals PWM_CH 4+ and PWM_CH 4− generated from the fourth pulse width modulator 14 and the PWM-based audio signals PWM_CH 6+ and PWM_CH 6− generated from the sixth pulse width modulator 16 are preferably phase-shifted by 90 degrees in the second phase shifter 22 and the third phase shifter 23, respectively.

Therefore, the first PCM-based audio signal PWM_CH1+/PWM_CH1− and the second PCM-based audio signal PWM_CH2+/PWM_CH2− having adjacent hardware signal processing paths, are 90 degrees out of phase with each other, such that their rising edge and their falling edge are out of phase with each other as shown in FIG. 9. Accordingly, reduced noise can be generated in a signal amplification process.

Likewise, a third PCM-based audio signal PWM_CH3+/PWM_CH3−, a fourth PCM-based audio signal PWM_CH4+/PWM_CH4−, a fifth PCM-based audio signal PWM_CH5+/PWM_CH5−, and a sixth PCM-based audio signal PWM_CH6+/PWM_CH6− are preferably 90 degrees out of phase with one another. Accordingly, a corresponding rising edge and their falling edge for adjacent signal paths can be out of phase with one another as shown in FIG. 9, thereby removing noise generated in a signal amplification process.

Figure 10:
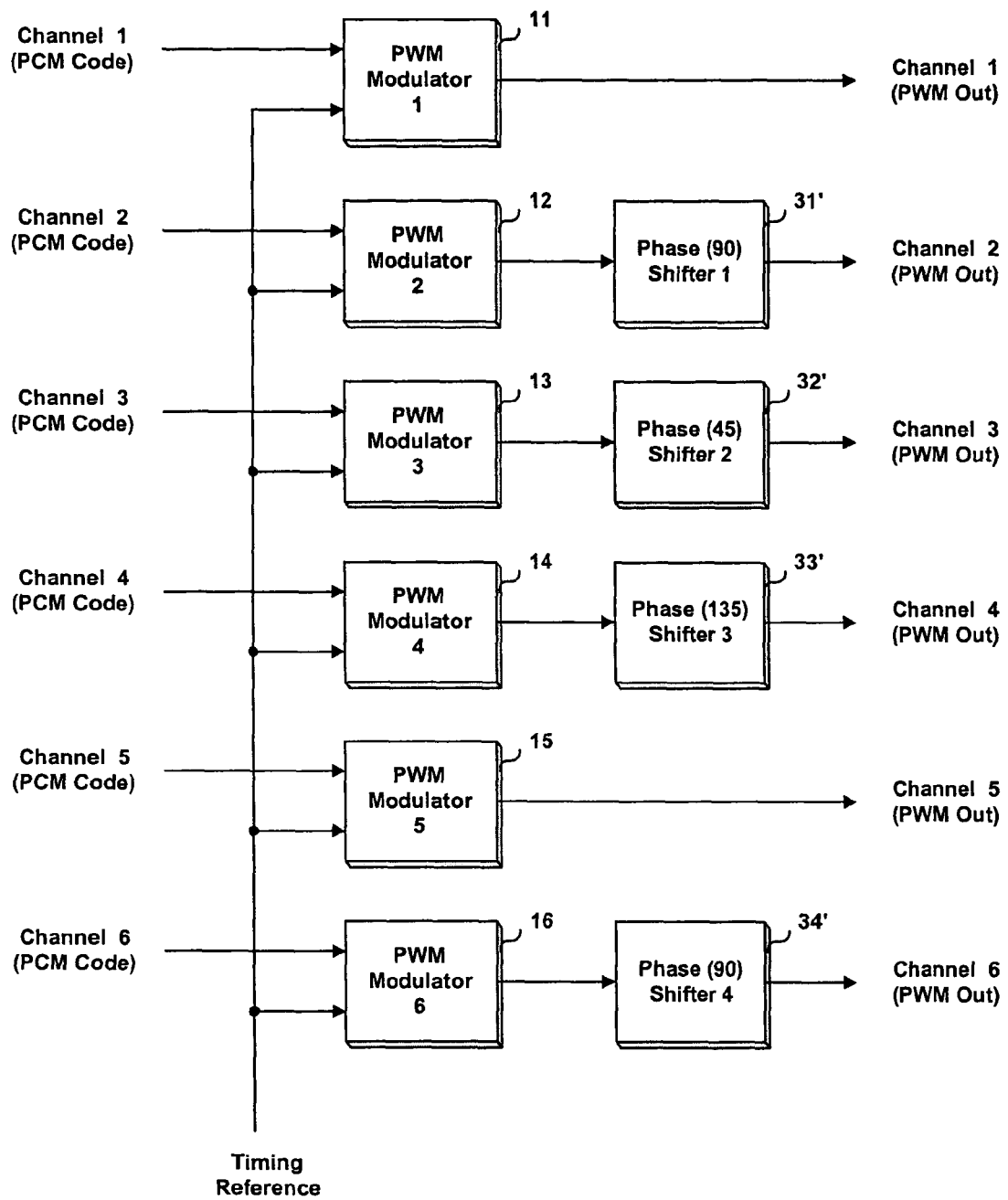
FIG. 10 is a block diagram showing a multi-channel PWM apparatus in accordance with a second preferred embodiment according to the present invention.

A multi-channel PWM apparatus according to a second preferred embodiment in accordance with the present invention will hereinafter be described with reference to FIGS. 10 and 11. As shown in FIG. 10, the multi-channel PWM apparatus according to the second preferred embodiment can be applied to a DVD receiver having an optical disc apparatus and an A/V receiver integrated as one body. The DVD receiver includes six pulse width modulators 11~16 for PWM-modulating a PCM-based two-channel audio signal of a CD and a PCM-based six-channel audio signal of a DVD while being classified according to individual channels.

In comparison with the related art multi-channel PWM apparatus of FIG. 2, the multi-channel PWM apparatus shown in FIG. 10 further preferably includes a plurality of phase shifters. A first phase shifter 31' is for phase-shifting an output signal of the second pulse width modulator 12 by e.g., 90 degrees, a second phase shifter 32' is for phase-shifting an output signal of the third pulse width modulator 13 by e.g., 45 degrees, a third phase shifter 33' is for phase-shifting an output signal of the fourth pulse width modulator 14 by e.g., 135 degrees, and a fourth phase shifter 34' is for phase-shifting an output signal of the sixth pulse width modulator 16 by e.g., 90 degrees.

Therefore, PWM-based audio signals PWM_CH 2+ and PWM_CH 2− generated from the second pulse width modulator 12 are phase-shifted by 90 degrees in the first phase shifter 31'. PWM-based audio signals PWM_CH 3+ and PWM_CH 3− generated from the third pulse width modulator 13 are phase-shifted by 45 degrees in the second phase shifter 32'.

The PWM-based audio signals PWM_CH 4+ and PWM_CH 4− generated from the fourth pulse width modulator 14 are phase-shifted by 135 degrees in the third phase shifter 33'. PWM-based audio signals PWM_CH 6+ and PWM_CH 6− generated from the sixth pulse width modulator 16 are phase-shifted by 90 degrees in the fourth phase shifter 34'.

Figure 11:
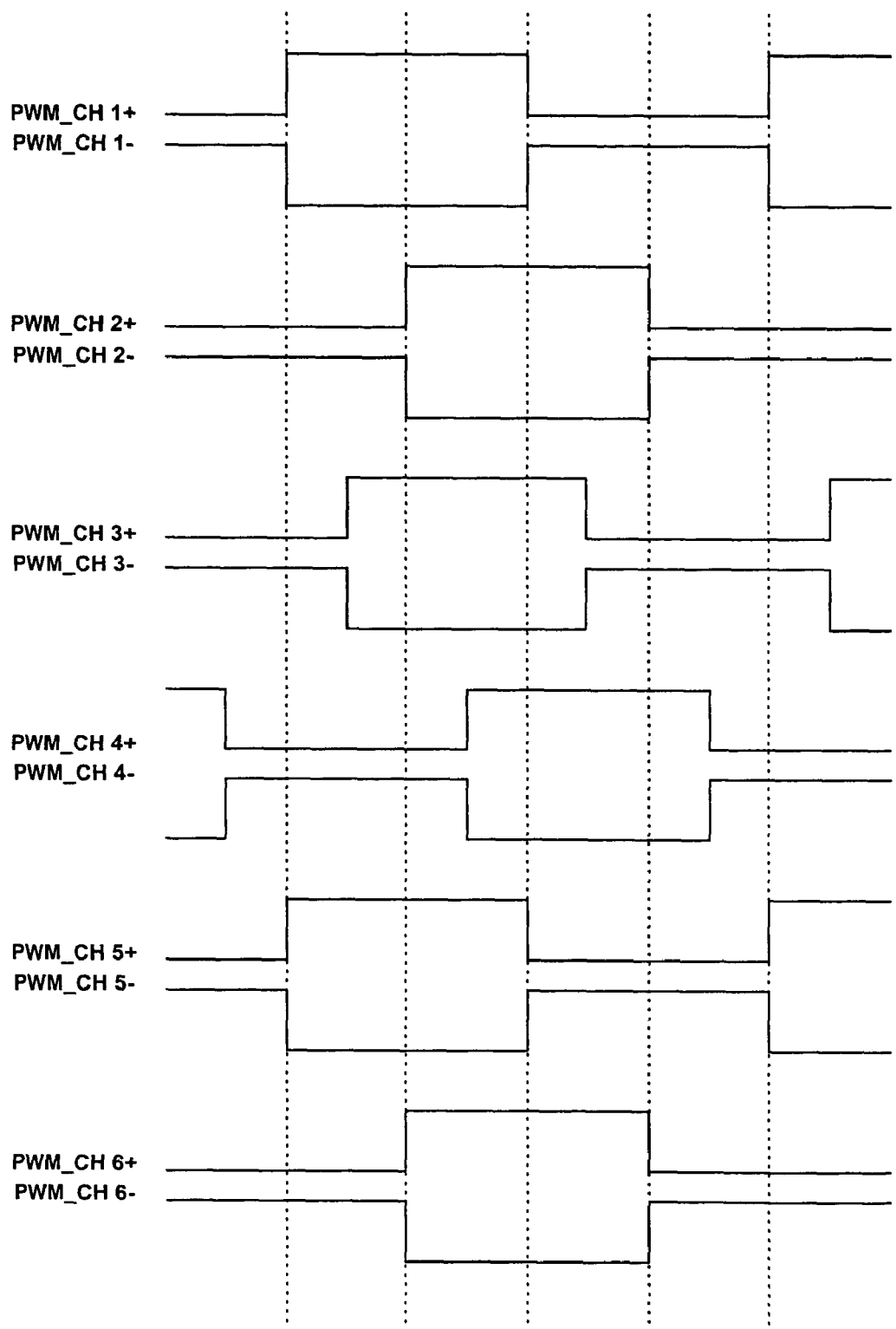
FIG. 11 is a waveform diagram illustrating output signals for every channel modulated and phase-shifted by the multi-channel PWM apparatus of FIG. 10.

Therefore, the first PCM-based audio signal PWM_CH1+/PWM_CH1− and the second PCM-based audio signal PWM_CH2+/PWM_CH2− having adjacent (e.g., hardware) signal processing paths, are preferably 90 degrees out of phase with each other, such that their rising edge and their falling edge are out of phase with each other as shown in FIG. 11. Thus, noise generated in a signal amplification process can be removed or reduced.

Likewise, a third PCM-based audio signal PWM_CH3+/PWM_CH3− is phase-shifted by 45 degrees, and a fourth PCM-based audio signal PWM_CH4+/PWM_CH4− is phase-shifted by 135 degrees, resulting in a phase difference of 90° between the third and fourth PCM-based audio signals. The third PCM-based audio signal PWM_CH3+/PWM_CH3− and the first PCM-based audio signal PWM_CH1+/PWM_CH1− are 45 degrees out of phase with each other. The fourth PCM-based audio signal PWM_CH4+/PWM_CH4− and the second PCM-based audio signal PWM_CH2+/PWM_CH2− are 45 degrees out of phase with each other. A fifth PCM-based audio signal PWM_CH5+/PWM_CH5− and a sixth PCM-based audio signal PWM_CH6+/PWM_CH6− are 90 degrees out of phase with each other, the fifth PCM-based audio signal PWM_CH5+/PWM_CH5− and the third PCM-based audio signal PWM_CH3+/PWM_CH3− are 45 degrees out of phase with each other, and the sixth PCM-based audio signal PWM_CH6+/PWM_CH6− and the fourth PCM-based audio signal PWM_CH4+/PWM_CH4− are 45 degrees out of phase with each other, such that their rising edge and their falling edge are out of phase with each other as shown in FIG. 11. However, the present invention is not intended to be so limited as other combinations of offset out of phase signals can be used that reduce generated noise. Thus, noise generated in a signal amplification process can be removed or reduced.

Figure 12:
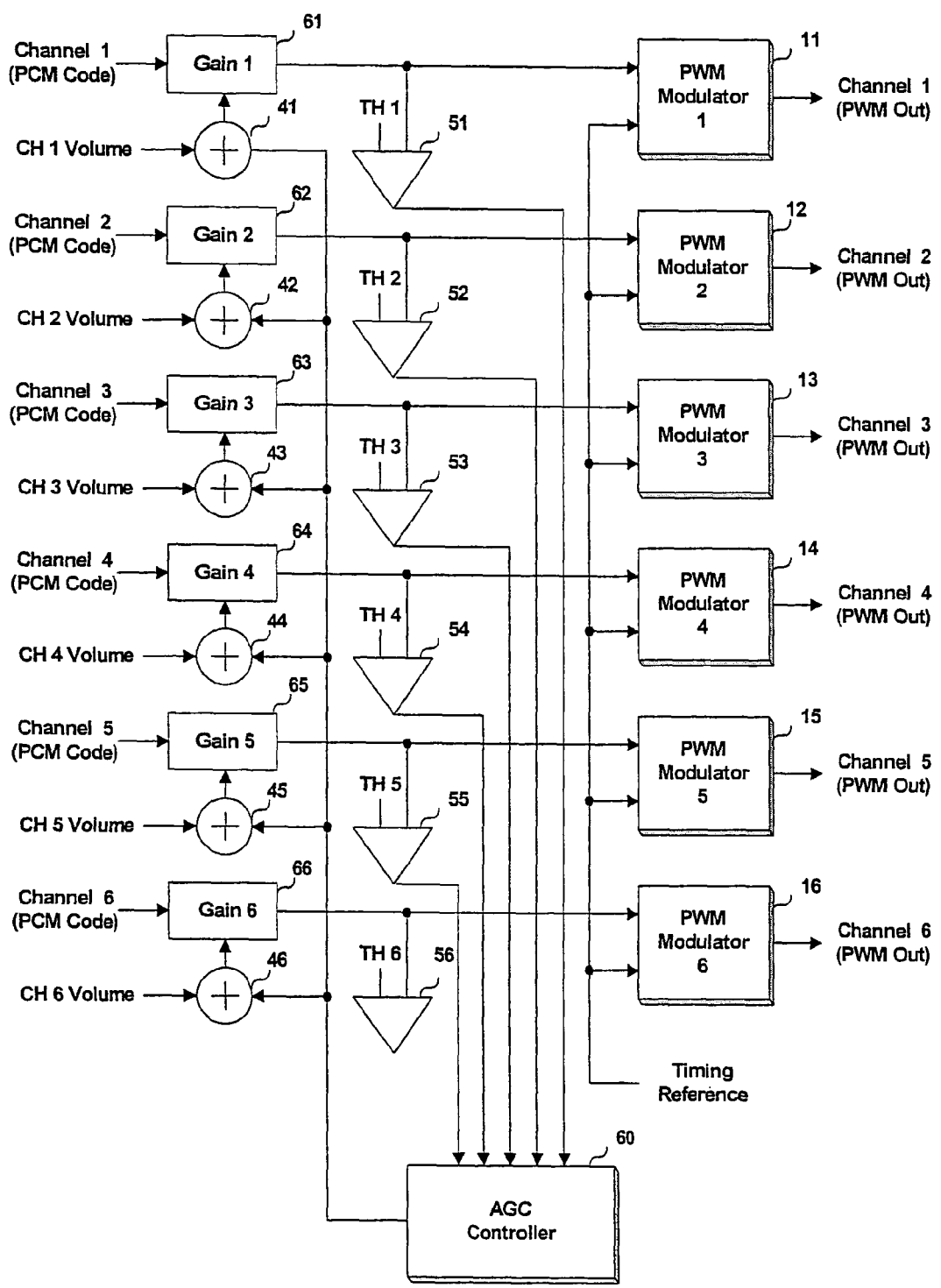
FIG. 12 is a block diagram showing a multi-channel PWM apparatus in accordance with a third preferred embodiment according to the present invention.

A multi-channel PWM apparatus according to a third preferred embodiment in accordance with the present invention will hereinafter be described with reference to FIGS. 12 and 13. As shown in FIG. 12, the multi-channel PWM apparatus according to the third preferred embodiment can be applied to a DVD receiver having an optical disc apparatus and an A/V receiver integrated as one body. The DVD receiver can include six pulse width modulators 11~16 for PWM-modulating a PCM-based two-channel audio signal of a CD and a PCM-based six-channel audio signal of a DVD divided by individual channels.

In comparison with the related art multi-channel PWM apparatus of FIG. 4, the multi-channel PWM apparatus shown in FIG. 12 can include six gain controllers 61~66 for receiving PCM-based audio signals applied to pulse width modulators 11~16 for every channel, and controlling their levels according to individual channels, six adders 41~46 and six comparators 51~56. The adders (e.g., six) 41~46 preferably add individual volume control signals CH1 Volume~CH6 Volume to individual control signals generated from an AGC (Automatic Gain Control) unit 60, respectively, or performing subtraction between the volume control signals and the control signals. The comparators 51~56 (e.g., six) preferably compare individual levels of audio signals outputted through the gain controllers 61~66 for every channel with individual reference values TH1, TH2, TH3, TH4, TH5 and TH6.

On the other hand, the gain controllers 61~66 for every channel variably control their own gain values by adding volume control signals CH1 Volume~CH6 Volume each applied to the adders 41~46 to control signals generated from the AGC unit 60.

For example, in the case of reproducing data of a CD in an optical disc apparatus of the DVD-receiver, a PCM-based two-channel audio signal is amplified to a prescribed level over first and second gain controllers 61 and 62, and then applied to the first and second pulse width modulators 11 and 12 while being classified according to individual channels. In the case of reproducing data of a DVD, a PCM-based six-channel audio signal is amplified to a prescribed level over the first to sixth gain controllers 61~66, and then applied to the first to sixth pulse width modulators 11~16 while being classified according to individual channels.

In this case, if a user variably adjusts a gain of his or her desired channel from among all channels, for example, if a user selects a first channel gain controller 61, a third channel gain controller 63, and a fifth channel gain controller 65 and variably controls them, a system controller (not shown) generates volume control signals CH1 Volume, CH3 Volume and CH5 Volume for variably controlling the first, third and fifth gain controllers 61, 63 and 65. These volume control signals can be added (or subtracted) to (or from) control signals generated from the AGC unit 60, such that the gain controllers 61, 63 and 65 of the corresponding channels are variably controlled.

In the case where a PCM-based audio signal generated from either one of the gain controllers 61, 63 and 65 having been variably controlled is compared with a prescribed reference value, the AGC unit 60 preferably generates a control signal for reducing/increasing a gain of a corresponding channel on the condition that the PCM-based audio signal has an excessively high or low level and unable to perform a necessary signal processing in the corresponding pulse width modulators.

Figure 13:
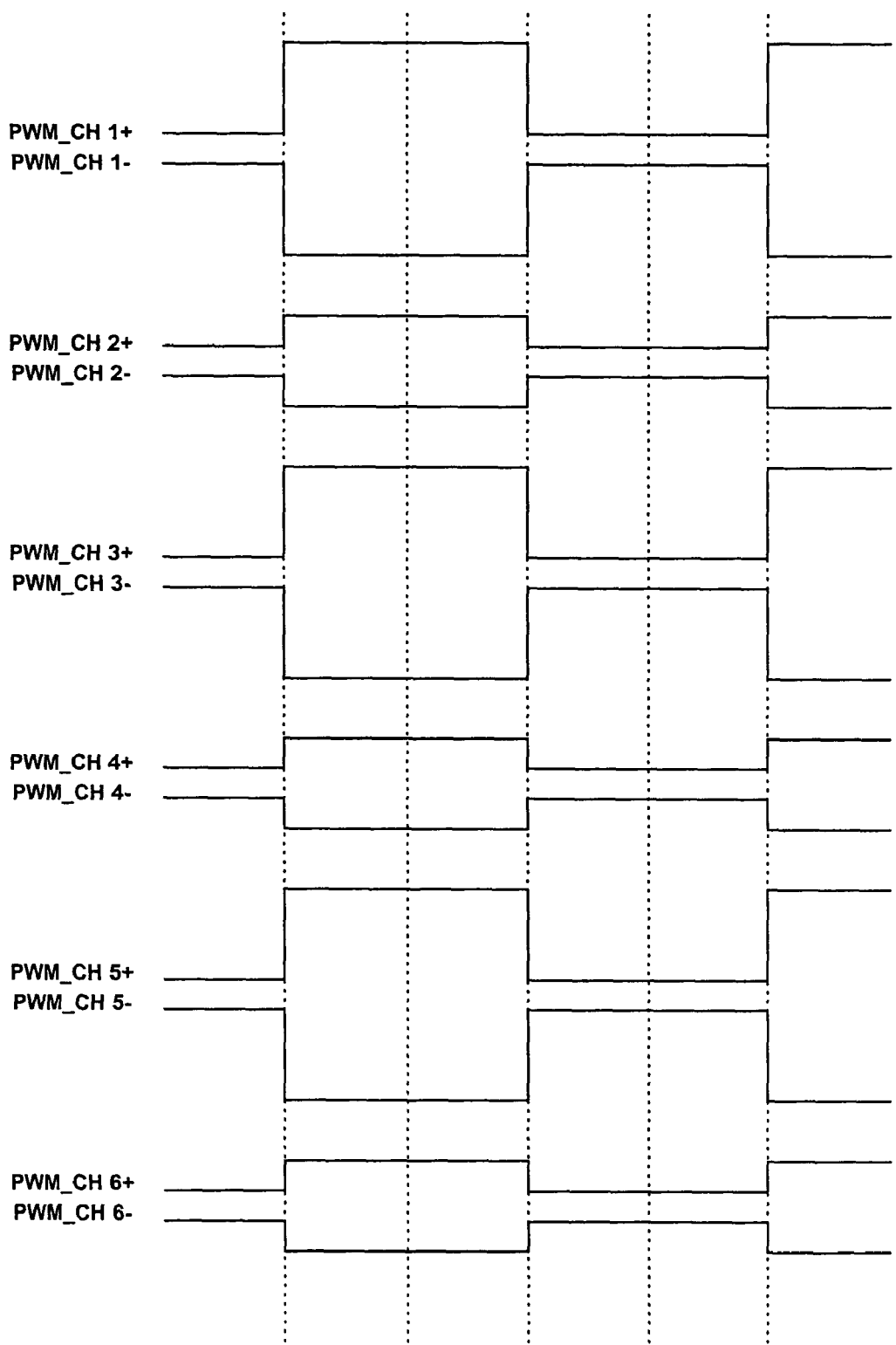
FIG. 13 is a waveform diagram illustrating output signals for every channel selectively amplified and modulated by the multi-channel PWM apparatus of FIG. 12.

Therefore, as shown in FIG. 13 for the example above, the pulse width modulators 11~16 output PWM-based audio signals PWM_CH 1+, PWM_CH 1−, PWM_CH 2+, PWM_CH 2−, PWM_CH 3+, PWM_CH 3−, PWM_CH 4+, PWM_CH 4−, PWM_CH 5+, PWM_CH 5−, PWM_CH 6+, and PWM_CH 6−, respectively. In this case, two audio signals PWM_CH 1 and PWM_CH 1−, PWM_CH 2+ and PWM_CH 2−, PWM_CH 3+ and PWM_CH 3−, PWM_CH 4+ and PWM_CH 4−, PWM_CH 5+ and PWM_CH 5−, or PWM_CH 6+ and PWM_CH 6− of each channel are 180 degrees out of phase with each other. In this case, it is possible to control audio signal levels of the first, third, and fifth channels selected by a user to be higher than those of the remaining channels, enabling generation of various sound fields outputted through speakers for every channel.

Figure 14:
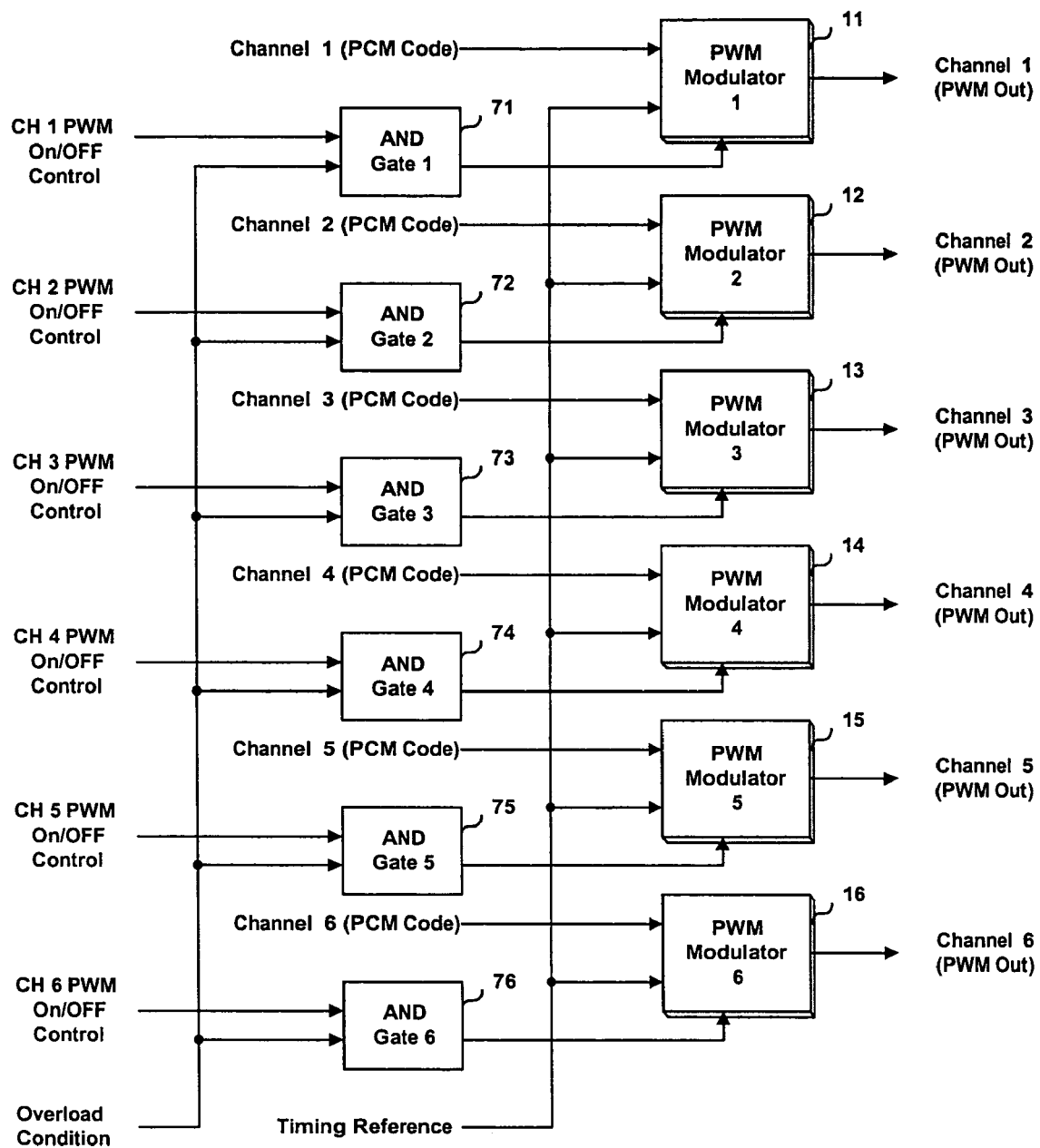
FIG. 14 is a block diagram showing a multi-channel PWM apparatus in accordance with a fourth preferred embodiment according to the present invention.

A multi-channel PWM apparatus according to a fourth preferred embodiment in accordance with the present invention will be described with reference to FIGS. 14 and 15. As shown in FIG. 14, the multi-channel PWM apparatus according to the fourth preferred embodiment can be applied to a DVD receiver having an optical disc apparatus and an A/V receiver integrated as one body. The DVD receiver includes six pulse width modulators 11~16 for PWM-modulating a PCM-based two-channel audio signal of a CD and a PCM-based six-channel audio signal of a DVD by individual channels.

In comparison with the related art multi-channel PWM apparatus of FIG. 6, the multi-channel PWM apparatus shown in FIG. 14 has no OR gate 17 of FIG. 6, and can include logic gates such as six AND gates 71~76 for independently and/or selectively turning on/off some pulse width modulators from among all the pulse width modulators 11~16. The six AND gates 71~76 preferably receive an overload condition signal for compulsorily tuning off the pulse width modulators under the condition that the value of system load is higher than a reference value, and PWM on/off control signals (denoted by CH1 PWM ON/OFF Control~CH6 PWM ON/OFF Control) for every channel for turning on/off all (e.g., six) pulse width modulators 11~16 or selectively turning on/off a few pulse width modulators from among the pulse width modulators 11~16 according to a user's key command, an optical disc type or the like.

In the meantime, in the case of reproducing data of a CD in an optical disc apparatus contained in the DVD receiver, a PCM-based two-channel audio signal can be applied to the first pulse width modulator 11 and the second pulse width modulator 12 while being classified according to individual channels, and the third to sixth pulse width modulators 13~16 have no input signal. In this case, the system controller (not shown) outputs a first channel PWM-ON-Control signal (e.g., CH1 PWM ON Control) for turning on the first pulse width modulator 11 to the first AND gate 71, and outputs a second channel PWM-ON-Control signal (e.g., CH2 PWM ON Control) for turning on the second pulse width modulator 12 to the second AND gate 72. In addition, the system controller outputs third to sixth channel PWM-OFF-Control signals (e.g., CH3 PWM OFF Control~CH6 PWM OFF Control) for turning off the third to sixth pulse width modulators 13~16 to the third to sixth AND gates 73~76, respectively.

Therefore, the first and second AND gates 71 and 72 output control signals for turning on the pulse width modulators 11 and 12, respectively. The third to sixth AND gates 73~76 output control signals for turning off the pulse width modulators 13~16, respectively.

Figure 15:
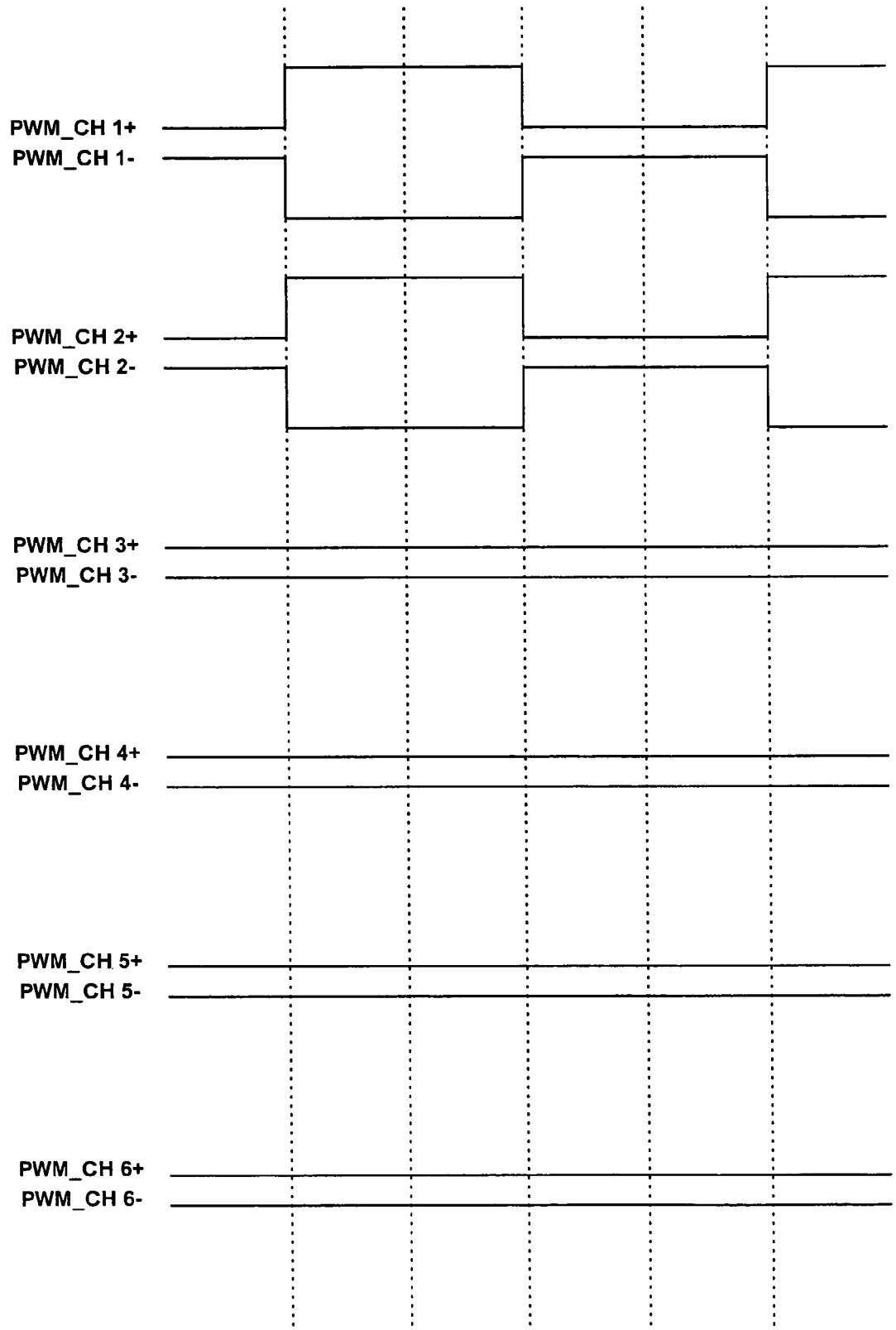
FIG. 15 is a waveform diagram illustrating output signals for every channel selectively amplified and modulated by the multi-channel PWM apparatus of FIG. 14.

Therefore, as shown in FIG. 15, the first and second pulse width modulators 11 and 12 output a first PWM-based audio signal PWM_CH 1+/PWM_CH 1− and a second PWM-based audio signal PWM_CH 2+/PWM_CH 2−. Here, two PWM-based audio signals PWM_CH 1+ and PWM_CH 1− are 180 degrees out of phase with each other, and two PWM-based audio signals PWM_CH 2+ and PWM_CH 2− are 180 degrees out of phase with each other. The remaining third to sixth pulse width modulators have no output signals, which can reduce or prevent noise that may occur due to output signals unnecessarily generated from the third to sixth pulse width modulators 13~16.

On the other hand, in the case of reproducing data of a DVD in an optical disc apparatus contained in the DVD receiver, a PCM-based six-channel audio signal can be applied to the first to sixth pulse width modulators 11~16 while being classified according to individual channels. In this case, the system controller (not shown) can output first to sixth channel PWM-ON-Control signals (e.g., 'CH1 PWM ON Control~CH6 PWM ON Control') for switching on the first to sixth pulse width modulators 11~16, respectively. Therefore, the first to sixth AND gates 71~76 output control signals for switching on pulse width modulators 11~16 to the first to sixth pulse width modulators 11~16, respectively. In this case, two PWM-based audio signals PWM_CH 1 and PWM_CH 1−, PWM_CH 2+ and PWM_CH 2−, PWM_CH 3+ and PWM_CH 3−, PWM_CH 4+ and PWM_CH 4−, PWM_CH 5+ and PWM_CH 5−, or PWM_CH 6+ and PWM_CH 6− can be 180 degrees out of phase with each other.

Further, even in the case where a user freely selects a few channels from among all the channels, only a pulse width modulator of the corresponding channel can be selectively driven using the above-described method and apparatus. Also, in the case where the value of system load is higher than a reference value, a control signal for turning off all the first to sixth pulse width modulators is outputted along with the overload condition signal, such that all the pulse width modulators 11~16 can be switched off at one time.

Meanwhile, although the multi-channel PWM apparatuses according to the first to fourth preferred embodiments of the present invention have been disclosed to be applied to the DVD receiver, they can also be applicable to a variety of electronic appliances having a plurality of pulse width modulators, for example, a HD-TV, an A/V Receiver, a car A/V System, and a Digital Audio Workstation, etc. Further, although the first to fourth preferred embodiments were individually described, they can be implemented and used in various combinations.

As described above, preferred embodiments according to the present invention use various logic circuits (e.g., AND gates). However, the present invention is not intended to be so limited as alternative combinations of logic circuits may be used.

As described above, preferred embodiments of a multi-channel PWM apparatus and method of using same have various advantages. According to the first and second preferred embodiments of the present invention, an apparatus for removing noise in a multi-channel PWM apparatus for modulating PCM-based multi-channel audio signals read from an optical medium into PWM-based multi-channel audio signals allows PCM-based audio signals having adjacent signal processing paths to have a different phase between individual channels, such that it effectively reduces or removes noise generated when amplifying the PCM-based audio signals. Accordingly, deterioration of the audio signals can be reduced or prevented from being deteriorated.

According to the third preferred embodiment of the present invention, a multi-channel PWM apparatus for modulating PCM-based multi-channel audio signals read from an optical medium into PWM-based multi-channel audio signals selectively varies only gains of some channels in a plurality of channels in order to allow an audio signal applied to a pulse width modulator to have a different level in individual channels, thereby effectively providing a user with a variety of sound fields.

In addition, according to the fourth preferred embodiment of the present invention, a multi-channel PWM apparatus for modulating PCM-based multi-channel audio signals read from an optical medium into PWM-based multi-channel audio signals can selectively turn on/off a subset of pulse width modulators from among a plurality of pulse width modulators to prevent a pulse width modulator having no need to execute a PWM operation from being unnecessarily driven, and also prevent meaningless output signals from acting as noise.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A multi-channel PWM (Pulse Width Modulator) apparatus, comprising:
   a plurality of pulse width modulators for modulating audio signals into PWM-based multi-channel audio signals; and
   a gain control unit, connected to the plurality of pulse width modulators, for independently controlling gains of the audio signals received at the plurality of pulse width modulators, wherein the gain control unit independently controls gains of at least a portion of the audio signals to be at different levels according to individual channels, the gain control unit controlling gains of at least the portion of the audio signals so that control of the gain of each of the portion of audio signals is not limited by control of the gain of the other audio signals, wherein the gain control unit comprises:
   a plurality of gain controllers, each varying a level of a respective audio signal of the multi-channel audio signals received at a corresponding one of the pulse width modulators;
   a plurality of comparators, each coupled to an output of a corresponding one of the gain controllers, that compare levels of audio signals generated from the gain controllers with a reference level;
   AGC (Automatic Gain Controller) configured to receive output signals of the comparators for variably controlling the gain controllers according to individual output signals of the comparators; and
   a plurality of adders that perform addition or subtraction operations based on control signals generated from the AGC and volume control signals for said channels, and independently varying gains for said channels based on results of the addition or subtraction operations,
   wherein each of the adders receives two input signals being a corresponding volume control signal and a corresponding control signal from the said AGC for a respective one of the channels, and outputs an independent gain control signal to a corresponding one of the gain controllers.

2. The apparatus as set forth in claim 1, wherein a number of the gain controllers, the comparators, or the adders is identical to a number of channels of the pulse width modulators.

3. The apparatus as set forth in claim 2, wherein the plurality of pulse width modulators receive a reference signal, and wherein the gain control unit controls gains of the audio signals when the reference signal indicates an overload condition.

4. The apparatus as set forth in claim 3, wherein the pulse width modulators include six pulse width modulators for PWM-modulating PCM-based six-channel audio signals read from an optical disc while being classified according to individual channels.

5. The apparatus as set forth in claim 1, comprising:
   a controller for independently turning on/off the plurality of pulse width modulators according to individual channels.

6. The apparatus as set forth in claim 5, wherein the controller includes a number of AND gates for selectively enabling or disabling a same number or a subset of pulse width modulators, each of the AND gates receiving an overload condition signal for compulsorily tuning off one or more of the pulse width modulators when a value of system load is higher than a reference value and a PWM on/off control signal for every channel for turning on/off the pulse width modulators according to a user's key signal or an optical disc type, each AND gate performing an AND operation between the overload condition signal and the PWM on/off control.

7. The apparatus as set forth in claim 1, wherein the gain control unit includes a plurality of gain controllers, each independently controlling a gain of audio signals received at a respective one of the pulse width modulators.

8. The apparatus as set forth in claim 1, wherein the gain control unit independently controls a first number of the audio signals to be at a first level and a second number of the audio signals to be at a second level.

9. The apparatus as set forth in claim 8, wherein the first number is greater than one and the second number is greater than one.

10. The apparatus as set forth in claim 1, further comprising:
    a controller to selectively turn off one or more of the pulse width modulators when a predetermined condition is detected.

11. The apparatus as set forth in claim 1, wherein the predetermined condition is an overload condition.

12. The apparatus as set forth in claim 1, further comprising:
    a controller to independently control phases of the audio signals,
    wherein the second controller adjusts phases of at least a portion of the audio signals to be different.

13. An audio/visual receiver, comprising:
    a reader configured to output a first data signal based on information stored in a recording medium;
    a tuner configured to output a second data signal;
    a decoder coupled to the reader configured to decode the data signals into audio signals;
    a pulse width modulator device configured to modulate the audio signals into PWM-based multi-channel audio signals that comprises,
      a plurality of pulse width modulators configured to modulate the audio signals into the PWM-based multi-channel audio signals; and
      a plurality of signal controllers coupled to the plurality of modulators to independently control at least one of input signals and output signals of the plurality of pulse width modulators, wherein the plurality of signal controllers comprise a plurality of controllers that independently enable the plurality of pulse width modulators according to individual channels, and wherein:
    the pulse width modulators comprise N pulse width modulators for PWM-modulating PCM-based N-channel audio signals read from the recording medium while being classified according to individual channels, wherein the controllers include N AND gates for selectively enabling all the N pulse width modulators or a subset of pulse width modulators from among the N pulse width modulators, where N is an integer such that N≠0, and
    the AND gates each receive an overload condition signal for compulsorily turning off the pulse width modulators when a value of system load is higher than a reference value, and PWM on/off control signals for every channel for turning on/off the pulse width modulators according to a user's key signal or an optical disc type, and performing an AND operation between the overload condition signal and the PWM on/off control signals.

14. The receiver of claim 13, further comprising:
a gain control unit that receives the audio signals and independently controls gains of at least a portion of the received audio signals to be different according to individual channels.

15. The apparatus as set forth in claim 14, wherein the gain control unit comprises:
a plurality of gain controllers;
a plurality of comparators, each coupled to a corresponding one of the gain controllers to compare a level of an audio signal generated from one the gain controllers with a reference level;
AGC (Automatic Gain Controller) configured to receive output signals of the comparators for variably controlling the gain controllers according to individual output signals of the comparators; and
a plurality of adders that perform addition or subtraction operations based on control signals generated from the AGC and volume control signals for each channel, and independently varying gains for said each channel
wherein each of the adders receives two input signals being a corresponding volume control signal and a control signal from the said AGG for a corresponding one of the channels and outputs an independent gain control signal to a corresponding gain controller.

* * * * *